United States Patent [19]

Ishida

[11] Patent Number: 5,336,941
[45] Date of Patent: Aug. 9, 1994

[54] SUPERCONDUCTING CIRCUIT AND METHOD FOR DRIVING THE SAME

[75] Inventor: Ichiro Ishida, Tokyo, Japan

[73] Assignee: NEC Corporation, Tokyo, Japan

[21] Appl. No.: 925,019

[22] Filed: Aug. 5, 1992

[30] Foreign Application Priority Data

Aug. 6, 1991 [JP] Japan .................. 3-196325

[51] Int. Cl.$^5$ .................. H03K 3/38
[52] U.S. Cl. .................. 307/277; 307/306; 505/864
[58] Field of Search .................. 307/306, 277, 245

[56] References Cited

U.S. PATENT DOCUMENTS

| | | | |
|---|---|---|---|
| 4,012,646 | 3/1977 | Fang et al. | 307/306 |
| 4,083,029 | 4/1978 | Lahiri | 307/306 |
| 4,371,796 | 2/1983 | Takada | 307/277 |
| 4,538,077 | 8/1985 | Sone | 307/306 |
| 4,559,459 | 12/1985 | Wang et al. | 307/306 |
| 4,918,328 | 4/1990 | Kuo | 307/306 |
| 4,956,642 | 9/1990 | Harada | 307/306 |
| 4,980,580 | 12/1990 | Ghoshal | 307/306 |

FOREIGN PATENT DOCUMENTS

| | | | |
|---|---|---|---|
| 58-103224 | 6/1983 | Japan | 307/306 |
| 58-124327 | 7/1983 | Japan | 307/306 |
| 58-146127 | 8/1983 | Japan | 307/277 |
| 60-254914 | 12/1985 | Japan | 307/277 |

OTHER PUBLICATIONS

"Josephson-Logic Devices and Circuits", IEEE Transactions On Electron Devices, vol. ED-27, No. 10, Oct. 1980, pp. 1857–1869, written by T. R. Gheewala.

*Primary Examiner*—E. Rollins Cross
*Assistant Examiner*—Thomas N. Moulis
*Attorney, Agent, or Firm*—Burns, Doane, Swecker & Mathis

[57] ABSTRACT

According to the present invention, there is provided a superconducting circuit including a Josephson tunnel junction 1 and a load resistor 2 connected in parallel to the Josephson tunnel junction, in which a current source 5 is connected to the input terminal for the Josephson tunnel junction 1 and which has a pulse generator 3 in order to superimpose a pulse current to the current i from the current source 5.

As the input signal, a current pulse is given to the current i within the range of below the critical current of the Josephson tunnel junction by means of the foregoing pulse generator 3 so that an excellent separation of the input and output is achieved without using any magnetic coupling circuit.

9 Claims, 3 Drawing Sheets

SUPERCONDUCTING CIRCUIT AND METHOD FOR DRIVING THE SAME

FIELD OF THE INVENTION

The present invention relates to a superconducting circuit using a Josephson tunnel junction and a method for driving the same.

BACKGROUND OF THE INVENTION

Conventionally, it has been proposed to arrange an electronic circuit such as a memory or a logic circuit or the like, which is suitable for high speed operation, by combining a Josephson tunnel junction with other circuit elements to utilize a high speed switching capability of the Josephson tunnel junction.

By the way, as reported in, for example, "IEEE TRANSACTIONS ON ELECTRON DEVICES", Vol. ED-27, No.10, October 1980, pp 1857 to 1869, written by T. R. Gheewala, conventionally, there has been utilized, as the input signal for switching the Josephson tunnel junction, a current for generating a magnetic field for inhibiting the critical current of the Josephson tunnel junction or a current superimposed on the current from a current source wherein a sum of the currents exceeds the critical current of the Josephson tunnel junction.

However, with a superconducting circuit in which the foregoing magnetic field generating current is utilized as the input signal to switch the Josephson tunnel junction, since a magnetic circuit for magnetically coupling the magnetic field generating circuit and the Josephson tunnel junction is necessary, it has been difficult to miniaturize the circuit. On the other hand, in a superconducting circuit which switches the Josephson tunnel junction by using the foregoing superimposed current as the input signal, since the input signal is turned into an output signal superimposed with the current from a current source, it has become difficult to separate the input and the output.

SUMMARY OF THE INVENTION

Accordingly, an object of the present invention is to provide a superconducting circuit which allows an excellent separation of the input and the output without using the magnetic coupling circuit, which impedes the miniaturization of the circuit.

Another object of the invention is to provide a method for driving the superconducting circuit which allows tile excellent separation of the input and the output without using the magnetic coupling circuit.

According to the present invention, in order to achieve the foregoing end, there is provided a superconducting circuit comprising a Josephson tunnel junction and a load resistor connected in parallel to the Josephson tunnel junction, in which a current source is connected to the input terminal of the Josephson tunnel ,junction, and a means is provided for changing the current supplied from the current source to the input terminal of tile Josephson tunnel .junction within the range of below the critical current of the Josephson tunnel junction.

According to one embodiment of the present invention, the foregoing means for changing the current is a pulse generator for superimposing a pulsed current on the current from the current source. The pulse generator may be connected to the input terminal of the Josephson tunnel junction in series with or in parallel to the current source.

In another embodiment of the present invention, the foregoing means for changing the current may be a means for changing the current from the current source which is incorporated within the current source.

In addition, according to the present invention, in order to achieve the foregoing end, there is provided a method for driving the superconducting circuit in which a current change within the range of below the critical current of the Josephson tunnel junction is given as the input signal to the input terminal of the Josephson tunnel junction connected in parallel to the load resistor.

In one embodiment of the present invention, the current pulse is entered to achieve the foregoing current change.

According to the superconducting circuit and the method for driving the same of the present invention, it is not necessary to use the magnetic coupling circuit which impedes miniaturization of the circuit, and it becomes possible to miniaturize the apparatus while it becomes easy to separate the input and the output because the current change of the input signal does not emerge at the output signal.

DETAILED DESCRIPTION OF THE PREFERRED EMBODIMENTS

Some specific embodiments of the present invention are hereinafter described with reference to the accompanying drawings.

Figure 1:
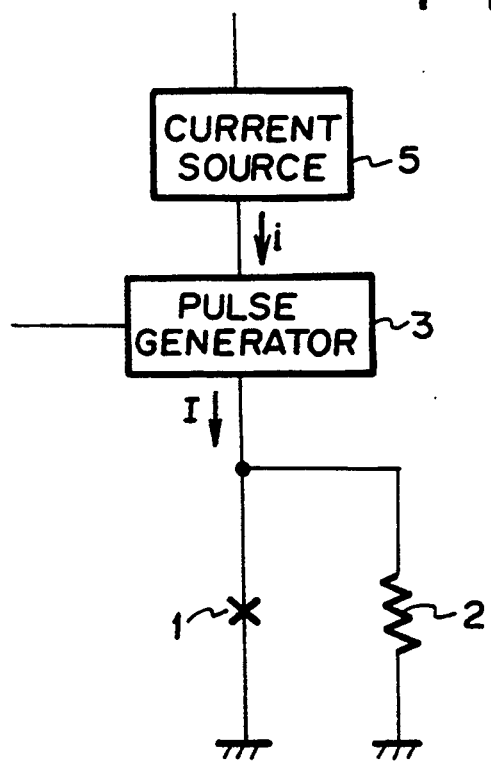
FIGS. 1 and 2 are respectively a view illustrating a specific embodiment of the superconducting circuit according to the present invention.

FIG. 1 is a view illustrating a first embodiment of the superconducting circuit according to the present invention. In the same figure, reference numeral 1 denotes a Josephson tunnel junction, and, in the junction, for example, niobium, may be used for the superconductors on both sides and the critical current may be 0.1 mA. One side of the Josephson tunnel junction 1 is connected to the ground while the other side is connected to one end of load resistor 2 of 25 Ω which is, for example, made of molybdenum, and the other end of the load resistor 2 is connected to the ground. Further, a pulse generator 3 for generating a current pulse $i_p$ whose width is 10 ps and whose height is 0,025 mA and a current source 5 for generating a current i up to 0.05 mA are connected in series to the connecting portion of the Josephson tunnel junction 1 and the load resistor 2.

Figure 2:
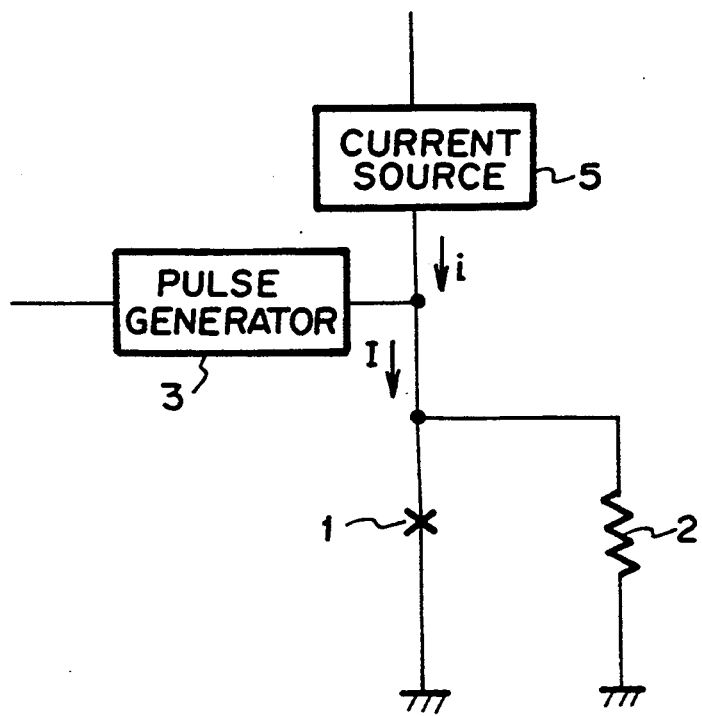

FIG. 2 is a view illustrating a second embodiment of the superconducting circuit according to the present invention. In the same figure, same signs are each assigned to the similar members as in FIG. 1. In this embodiment, the pulse generator 3 is connected in parallel to the current source 5.

Figure 3A:
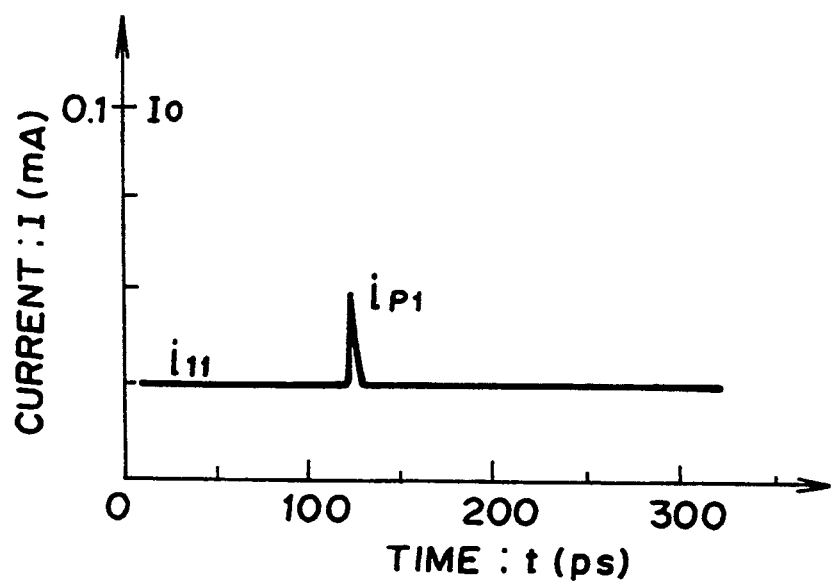
FIGS. 3A, 3B, 4A and 4B are respectively a diagram illustrating the input current (I) used when the superconducting circuit of the present invention is driven.
Figure 3B:
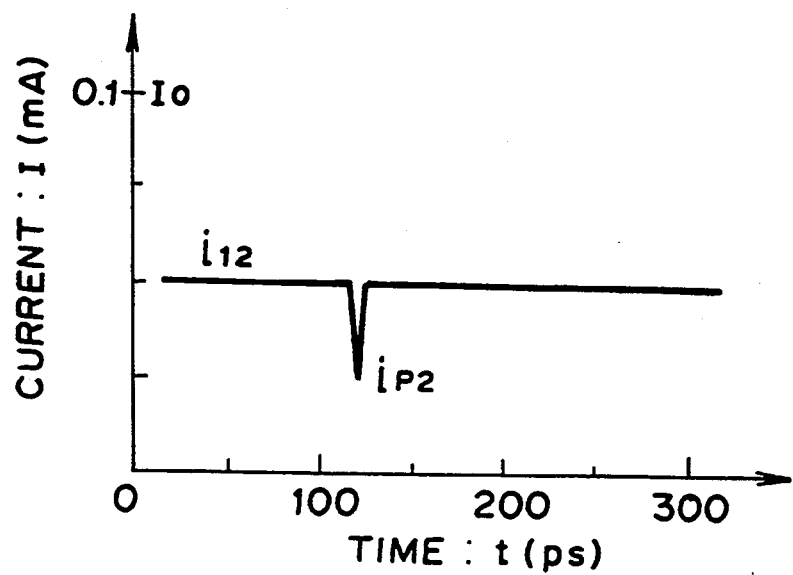

FIGS. 3A and 3B are respectively a diagram illustrating the-input current (I) used when the foregoing superconducting circuit of the present invention is driven.

As shown in FIG. 3A, a stationary current $i_{11}$ of 0.025 mA was supplied from the current source 5 to the connecting portion of the Josephson tunnel ,junction 1 whose critical current $I_o$ is 0.1 mA and molybdenum resistor 2 of 25 Ω which is connected in parallel to the junction. The other end of Josephson tunnel junction 1 and the other end of resistor 2 were connected to the ground. As the input signal, as shown in FIG. 3A, current pulse $i_{p1}$ whose width is 10 ps and whose height is 0.025 mA was applied. As a result, Josephson tunnel junction 1 switched from the zero voltage state to the nonzero voltage state.

That is, when the Josephson tunnel junction 1 is in the zero voltage state, the current i almost all flows through the Josephson tunnel junction 1 without practically flowing through load resistor 2. The magnitude of that current I is defined by $I = I_o \sin\theta$. Here, $I_o$ denotes the critical current of Josephson tunnel junction 1, and $\theta$ the phase difference between the electron wave functions on both sides of the junction. Next, when current pulse $i_p$ is generated in the pulse generator 3, a current amounting to $(i+i_p)$ instantaneously flows through the junction 1. At this time, the current change in term of time equals $di_p/dt = i_0 \cos\theta \, d\theta/dt$. By the way, since $d\theta/dt$ is proportional to V, a voltage V is generated in the junction 1. As a result, the Josephson tunnel junction 1 switches to the nonzero voltage state. The Josephson tunnel junction is of latching type, in which even if pulse current $i_p$ becomes zero, the nonzero voltage state is maintained, and the current I practically all flows into the resistor. Thus, switching is completed.

As shown in FIG. 3B, a stationary current $i_{12}$ of 0.05 mA was supplied from the current source 5 to the connecting portion of Josephson tunnel junction 1 whose critical current $I_o$ is 0.1 mA and molybdenum resistor 2 of 25 Ω, which is connected in parallel to the junction. The other end of Josephson tunnel junction 1 and the other end of resistor 2 were connected to the ground. As the input signal, as shown in FIG. 3B, current pulse $i_{p2}$ whose width is 10 ps and whose height is −0.025 mA was applied. As a result, Josephson tunnel junction 1 switched from the zero voltage state to the nonzero voltage state.

Figure 4A:
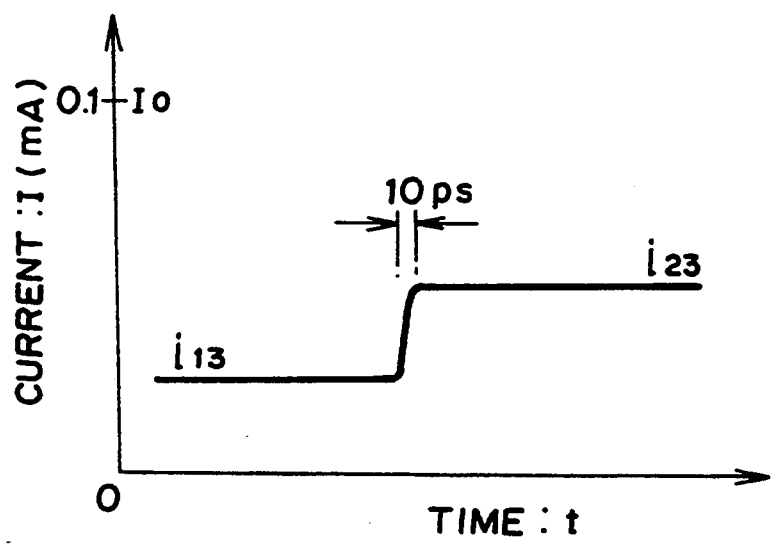
Figure 4B:
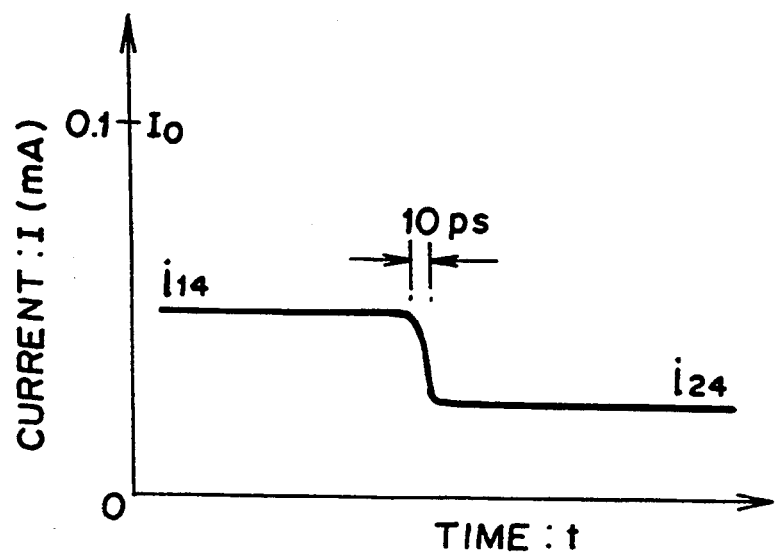

FIGS. 4A and 4B are respectively a diagram illustrating the input current (I) used when the superconducting circuit is driven without operating the pulse generator 3.

As shown in FIG. 4A, a stationary current $i_{13}$ of 0.025 mA was supplied from the current source 5 to the connecting portion of Josephson tunnel junction 1 whose critical current $I_o$ is 0.1 mA and molybdenum resistor 2 of 25 Ω, which is connected in parallel to the junction. The other end of the Josephson tunnel junction 1 and the other end of the resistor 2 were connected to the around. As the input signal, as shown in FIG. 4A, a step current $i_{23}$ whose rise time is 10 ps and whose height is 0.025 mA was applied. As a result, Josephson tunnel junction 1 switched from the zero voltage state to the nonzero voltage state. In this embodiment, the step current $i_{23}$ was realized by means of the means for changing the current from the current source 5, which is incorporated within the current source 5, without operating the pulse generator 3.

As shown in FIG. 4B, a stationary current $i_{14}$ of 0.05 mA was supplied from the current source 5 to the connecting portion of the Josephson tunnel junction 1 whose critical current $I_o$ is 0.1 mA and tile molybdenum resistor 2 of 25 Ω, which is connected in parallel to the junction. The other end of the Josephson tunnel junction 1 and the other end of the resistor 2 were connected to the ground. As the input signal, as shown in FIG. 4B, a step current $i_{24}$ whose fall time is 10 ps and whose height is −0.025 mA was applied. As a result, the Josephson tunnel junction 1 switched from the zero voltage state to the nonzero voltage state.

It is of course that the present invention is not restricted to the foregoing embodiments, but various changes and modifications may be added thereto within the scope and spirit of the present invention. In particular, although, in the foregoing embodiments, 10 ps was used as the time required for changing the current supplied to the input terminal of the Josephson tunnel junction 1, for example, the time within the range of 0.1 ps through 500 ps may be adopted according to the present invention. Further, although, as the current change supplied to the input terminal of the Josephson tunnel junction 1, in the foregoing embodiments, 0.025 mA was used, according to the present invention, for example, 0.1 μA through 1 mA may be adopted.

What is claimed is:

1. A superconducting circuit comprising;
   a Josephson tunnel junction;
   a load resistor connected in parallel to the Josephson tunnel junction;
   a current source connected to an input terminal of said Josephson tunnel junction, and
   means for changing a current supplied from said current source to the input terminal of said Josephson tunnel junction within a range below a critical current of said Josephson tunnel junction and wherein a rate of change of the current supplied to the input terminal of the Josephson tunnel junction is used as a controlling factor for switching said Josephson tunnel junction.

2. The superconducting circuit as set forth in claim 1 wherein said means for changing the current comprises a pulse generator for superimposing a pulsed current on said current from the current source.

3. The superconducting circuit as set forth in claim 2 wherein said pulse generator is connected to the input terminal of said Josephson tunnel junction in series with the current source.

4. The superconducting circuit as set forth in claim 2 wherein said pulse generator is connected to the input terminal of said Josephson tunnel junction in parallel to the current source.

5. The superconducting circuit as set forth in claim 1 wherein said means for changing the current comprises a means for changing the current from the current source which is incorporated within said current source.

6. A method for driving a superconducting circuit comprising the steps of:
   providing a current change within a range below a critical current of the Josephson tunnel junction is given, as an input signal to an input terminal of the Josephson runnel junction connected in parallel to a load resistor, and
   Using a rate of said current change as a controlling factor for switching said Josephson tunnel junction, 7. The method for driving a superconducting circuit as set forth in claim 6 further comprising the step of providing a current pulse in order to provide said current change.

8. A superconducting circuit comprising:
   a Josephson tunnel junction having an input terminal;
   a current source connected to said input terminal for applying a current thereto;

means for changing said current between a first and a second magnitude, wherein both of said first and second magnitudes are less than a critical magnitude of said Josephson tunnel junction.

9. The superconducting device of claim 8, further comprising:
means for switching said Josephson tunnel junction based on, at least in part, a rate of change of said current.

* * * * *